(12) United States Patent
Paek et al.

(10) Patent No.: US 9,831,293 B2
(45) Date of Patent: Nov. 28, 2017

(54) ORGANIC LIGHT EMITTING DISPLAY DEVICE, METHOD OF FABRICATING THE SAME, AND COLOR FILTER PLATE

(71) Applicant: LG DISPLAY CO., LTD., Seoul (KR)

(72) Inventors: Seung-Han Paek, Bucheon-si (KR); Hyo-Dae Bae, Daegu (KR); Young-Mu Oh, Seoul (KR); Jeong-Won Lee, Goyang-si (KR); Heon-Il Song, Paju-si (KR); Jong-Hoon Yeo, Incheon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/250,403

(22) Filed: Aug. 29, 2016

(65) Prior Publication Data

US 2017/0062529 A1    Mar. 2, 2017

(30) Foreign Application Priority Data

Aug. 31, 2015    (KR) .................... 10-2015-0122627

(51) Int. Cl.
  *H01L 27/32*    (2006.01)
  *G02B 5/22*     (2006.01)
  *G02B 5/20*     (2006.01)
  *H01L 51/52*    (2006.01)

(52) U.S. Cl.
  CPC ............ *H01L 27/322* (2013.01); *G02B 5/201* (2013.01); *G02B 5/223* (2013.01); *H01L 27/3244* (2013.01); *H01L 51/5284* (2013.01); *H01L 2251/5338* (2013.01)

(58) Field of Classification Search
  CPC ... H01L 27/322; H01L 51/5284; H01L 51/56; H01L 27/3244; H01L 2227/323; G02B 5/223; G02B 5/201
  See application file for complete search history.

(56) References Cited

U.S. PATENT DOCUMENTS

| | | | | |
|---|---|---|---|---|
| 5,817,411 A * | 10/1998 | Nakajima | ............. | F16D 69/026 428/334 |
| 7,728,516 B2 * | 6/2010 | Kawaguchi | ........... | H01L 27/322 313/498 |
| 7,791,271 B2 * | 9/2010 | Cok | ...................... | H01L 27/322 313/506 |
| 8,629,614 B2 * | 1/2014 | Nakamura | ............ | H01L 27/322 257/40 |

(Continued)

FOREIGN PATENT DOCUMENTS

| | | |
|---|---|---|
| JP | 2003-282259 A | 10/2003 |
| JP | 2015-84000 A | 4/2015 |
| TW | 200641096 A | 12/2006 |

*Primary Examiner* — William Coleman
(74) *Attorney, Agent, or Firm* — Birch, Stewart, Kolasch & Birch, LLP

(57) ABSTRACT

A color filter plate for a display device according to an embodiment includes a substrate including a first pixel region; a first color filter pattern over the substrate and transmitting light having a first wavelength range; and a first dye layer corresponding to the first color filter pattern and over the substrate, the first dye layer including first and second dyes, wherein the first dye absorbs light having a second wavelength range other than the first wavelength range, and the second dye absorbs light having a third wavelength range other than the first wavelength range and the second wavelength range.

20 Claims, 7 Drawing Sheets

(56) References Cited

U.S. PATENT DOCUMENTS

| | | | |
|---|---|---|---|
| 2005/0207044 A1* | 9/2005 | Oon | G02B 5/201 359/885 |
| 2008/0252198 A1* | 10/2008 | Katano | C09K 11/06 313/503 |
| 2014/0368766 A1* | 12/2014 | Shibata | G02B 5/201 349/61 |
| 2015/0349034 A1* | 12/2015 | Hack | H01L 27/3218 257/40 |

* cited by examiner

ORGANIC LIGHT EMITTING DISPLAY DEVICE, METHOD OF FABRICATING THE SAME, AND COLOR FILTER PLATE

CROSS-REFERENCE TO RELATED APPLICATION

This application claims the priority benefit of Korean Patent Application No. 10-2015-0122627, filed in Republic of Korea on Aug. 31, 2015, which is hereby incorporated by reference.

BACKGROUND

1. Field of the Invention

Embodiments of the invention relate to a color filter plate and an organic light emitting display (OLED) device, and more particularly, to a color filter plate and an OLED device being capable of preventing a visibility degradation by an ambient light and improving transmissivity and a method of fabricating the OLED device.

2. Discussion of the Related Art

Recently, flat panel display devices, such as a plasma display panel (PDP), a liquid crystal display (LCD) device, and an OLED device, are widely researched and used.

Among these flat panel display devices, since the OLED device as a self-emission type display device does not implement a backlight unit, the OLED device may have advantages of light weight and thin profile.

In addition, the OLED device has excellent characteristics of a viewing angle, a contrast ratio, power consumption, a response time, production costs, production yield, and so on.

An organic emitting diode of the OLED device may include first and second electrodes and an organic emitting layer, which includes a hole transporting layer (HTL), an electron transporting layer (ETL) and an emitting material layer (EML) therebetween, between the first and second electrodes.

In addition, to improve an emitting efficiency, the organic emitting layer may further include a hole injection layer (HIL) between the first electrode and the HTL and an electron injection layer (EIL) between the second electrode and the ETL.

When voltages are applied to the first and second electrodes, the holes from the first electrode and the electrons from the second electrodes are combined in the EML such that excitons are generated. The excitons are transited from an exciting state to a ground state such that the light is emitted from the organic emitting layer.

FIG. 1 is a schematic view illustrating a related art OLED device.

Referring to FIG. 1, the OLED device 10 includes the second electrode (not shown) as a cathode. To facilitate the electron injection and increase the emitting efficiency, the second electrode may be formed of a metallic material, e.g., magnesium, magnesium-silver alloy, aluminum, lithium-aluminum alloy and calcium. However, the second electrode of the above metallic material has a high light reflectance. As a result, the ambient light is reflected by the second electrode such that the visibility of the OLED device 10 is degraded. Namely, the ambient contrast ratio of the OLED device 10 is decreased.

To prevent the above problem, a circular polarization plate, which includes a linear polarization plate 70 and a ¼ retardation plate 30, is disposed on or over the second electrode.

However, when the circular polarization plate is used, the light from the organic emitting layer of the OLED device 10 (i.e., the internal light) is absorbed by the circular polarization plate such the OLED device 10 may have that the transmissivity below about 43%. Namely, the transmissivity of the OLED device 10 is remarkably decreased. To compensate the decreased transmissivity, the power consumption of the OLED device 10 should be increased.

On the other hand, since the circular polarization plate is susceptible to damage from moisture, a tri-acetyl-cellulose (TAC) film is attached to lower and upper sides of the circular polarization plate to protect the circular polarization plate from the moisture.

However, since the TAC film has a hard (i.e., solid or stiff) property, the circular polarization plate including the TAC films is difficult to use for a flexible OLED device.

SUMMARY

Accordingly, the present invention is directed to a flexible OLED device, a method of fabricating the same, and a color filter plate that substantially obviate one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, a color filter plate includes a substrate including a first pixel region; a first color filter pattern over the substrate and transmitting light having a first wavelength range; and a first dye layer corresponding to the first color filter pattern and over the substrate, the first dye layer including first and second dyes, wherein the first dye absorbs light having a second wavelength range other than the first wavelength range, and the second dye absorbs light having a third wavelength range other than the first wavelength range and the second wavelength range.

In another aspect, a display panel includes first and second substrates facing each other and including a first pixel region; a thin-film transistor between the first substrate and the second substrate; a first color filter pattern over the second substrate and transmitting light having a first wavelength range; and a first dye layer corresponding to the first color filter pattern and over the second substrate, the first dye layer including first and second dyes, wherein the first dye absorbs light having a second wavelength range other than the first wavelength range, and the second dye absorbs light having a third wavelength range other than the first wavelength range and the second wavelength range.

In another aspect, an organic light emitting display (OLED) device includes first and second substrates facing each other and including a first pixel region; an organic emitting diode between the first and second substrates and in the first pixel region; and an adhesive layer between the second substrate and the organic emitting diode and including first to third dyes, wherein the first dye absorbs light having a wavelength range below 450 nm, and the second dye absorbs light having a wavelength range of 550 to 650 nm, and wherein the third dye absorbs light having a wavelength range above 720 nm.

In another aspect, a method of fabricating an organic light emitting display (OLED) device includes forming an organic emitting diode on a first substrate including red, green and blue pixel regions; forming red, green and blue color filter pattern on a second substrate, the red, green and blue color filter patterns respectively corresponding to the red, green and blue pixel regions; forming first to third dye layers respectively on the red, green and blue color filter patterns; and attaching the first and second substrates, wherein the first dye layer includes first and second dyes, and the second dye layer includes the first dye and a third dye, wherein the third dye layer includes the second and third dyes, and the first to third dyes respectively absorbs light having first to third wavelength ranges, respectively, and wherein the second wavelength range is larger than the first wavelength range and smaller than the third wavelength range.

It is to be understood that both the foregoing general description and the following detailed description are by example and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE EMBODIMENTS

Reference will now be made in detail to embodiments of the invention, examples of which are illustrated in the accompanying drawings.

Figure 2:
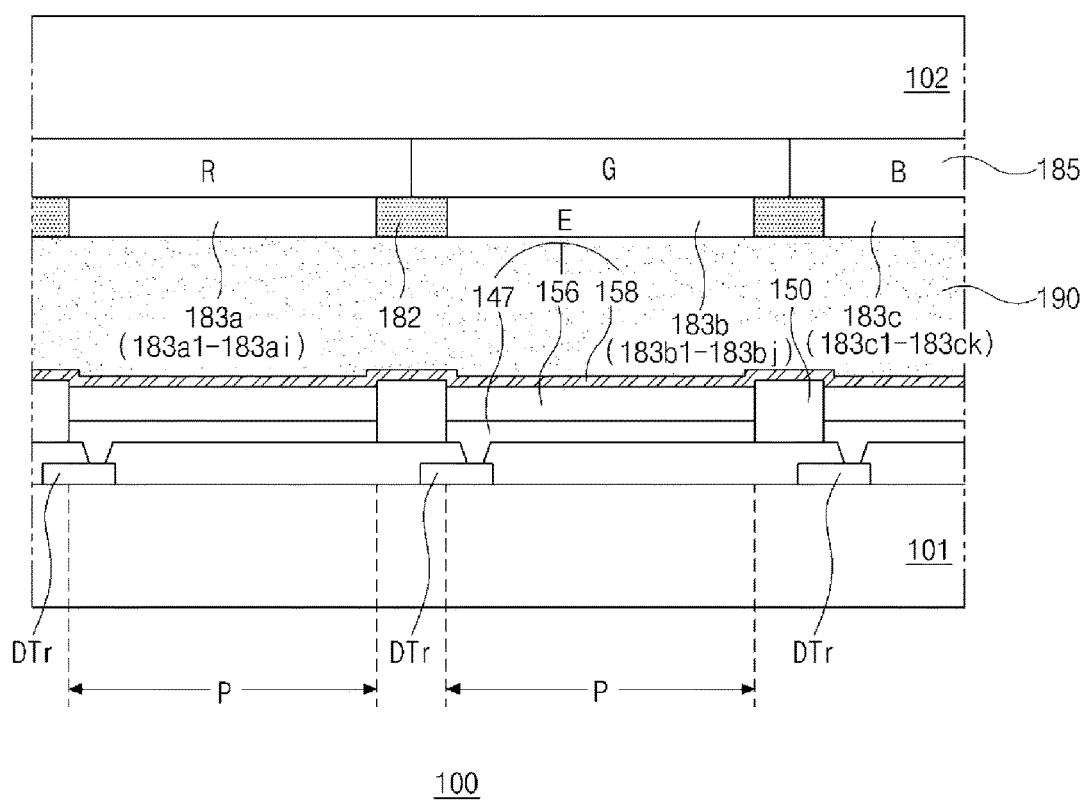
FIG. 2 is a schematic cross-sectional view of an OLED device according to a first embodiment of the present invention.

FIG. 2 is a schematic cross-sectional view of an OLED device according to the first embodiment of the present invention. All the components of the OLED device according to all embodiments of the present invention are operatively coupled and configured.

As shown in FIG. 2, the OLED device 100 includes a first substrate 101 including pixel regions P, a second substrate 102 facing the first substrate 101, an organic emitting diode E, first to third dye layer 183a, 183b and 183c and a color filter layer 185 including red, green and blue color filter patterns R, G and B. Each of the first, second and third dye layers 183a, 183b and 183c includes more than one dye to absorb light having a different wavelength range. Each dye layer is labelled 183a (183a1-183ai), 183b (183b1-183bj) and 183c (183c1-183ck), as illustrated in FIGS. 2, 3E and 3F to indicate that each of the dye layers 183a, 183b and 183c includes more than one dye, where i, j and k each represents a natural number higher than one. The pixel regions P includes red, green and blue pixel regions P, and the red, green and blue color filter patterns R, G and B respectively corresponds to the red, green and blue pixel regions P.

Each of the first and second substrates 101 and 102 may have a flexible property. For example, each of the first and second substrates 101 and 102 may include a flexible glass or a flexible plastic.

A driving thin film transistor (TFT) DTr is formed on or over the substrate 101 in each pixel region P, and a bank 150 is formed over the first substrate 101 at a boundary of the pixel regions P.

The organic emitting diode E is disposed between the first and second substrates 101 and 102 and is electrically connected to the driving TFT DTr. The organic emitting diode E includes first and second electrodes 147 and 158 and an organic emitting layer 156 between the first and second electrodes 147 and 158. The first electrode 147 is electrically connected to an electrode of the driving TFT DTr and has an island shape in each pixel region P to be separated in adjacent pixel regions P. The organic emitting layer 156 in the pixel regions P is formed of the same material. For example, the white light may be emitted from the organic emitting layer 156 in all of the pixel regions P. The second electrode 158 covers an entire of a display area of the OLED device 100.

The first electrode 147 may include a relatively high work function material to serve as an anode, and the second electrode 158 may include a relatively low work function material to serve as a cathode. For example, the first electrode 147 may include a transparent conductive material, e.g., indium-tin-oxide (ITO) or indium-zinc-oxide (IZO), and the second electrode 158 may include a metallic material, e.g., magnesium, magnesium-silver alloy, aluminum, lithium-aluminum alloy or calcium.

The color filter layer 185 is formed on or over the second substrate 102, and a black matrix 182, which has a lattice shape and corresponds to a boundary of the pixel regions P, is formed on the color filter layer 185. Namely, the black matrix 182 may overlap the bank 150.

The color filter layer 185 may provide a flat top surface, and the black matrix 182 is formed to expose a portion of the color filter layer 185 in the pixel region P. Namely, the black matrix 182 is positioned at a boundary of the adjacent color filter patterns R, G and B. The black matrix 182 has an opening in correspondence to the pixel region P such that the color filter layer 185 and the black matrix 182 provide an uneven top surface.

In addition, the first to third dye layers 183a, 183b, 183c are formed on the color filter layer 185 and correspond to the pixel regions P. The first to third dye layers 183a to 183c correspond to the red, green and blue color filter patterns R, G and B, respectively. In other words, the first to third dye layers 183a, 183b, 183c fill the openings of the black matrix 182 such that the first to third dye layers 183a, 183b, 183c and the black matrix 182 may provide a flat top surface.

The color filter layer 185 is positioned between the organic emitting diode E and the second substrate 102, and the first to third dye layers 183a to 183c are positioned between the organic emitting diode E and the color filter layer 185.

The first dye layer 183a includes a first dye absorbing the light of a first wavelength range and a second dye absorbing the light of a second wavelength range. The second dye layer 183b includes the first dye and a third dye absorbing the light of a third wavelength range. The third dye layer 183c includes the second and third dyes.

The center wavelength of the second wavelength range is larger than that of the first wavelength range and smaller than that of the third wavelength range. For example, the first wavelength range corresponds to a blue wavelength range and may be about 450 to 490 nm. The second wavelength range corresponds to a green wavelength range and may be about 490 to 550 nm. The third wavelength range corresponds to a red wavelength range and may be about 650 to 720 nm.

In addition, each of the first to third dye layers 183a to 183c may further include at least one of a fourth dye absorbing a fourth wavelength range whose center wavelength is smaller than that of the first wavelength range, a fifth dye absorbing a fifth wavelength range whose center wavelength is larger than that of the third wavelength range, and a sixth dye absorbing a sixth wavelength range whose center wavelength is between that of the second and that of the third wavelength ranges. For example, each of the first to third dye layers 183a to 183c may further include all of the fourth to sixth dyes.

For example, the first dye may include at least one being selected from the group consisting of acridine orange, acridine yellow, proflavin (acridine-based compounds), auramine O (arylmethine-based compound), coumarin 6, coumarin 343 (coumarin-based compounds), 4-(dicyanomethylene)-2-methyl-6-(p-dimethylaminostyryl)-4H-pyran (DCM) and 4-Dimethylamino-4'-nitrostilbene (merocyanine-based compounds). The first dye may be a mixture of at least two of the above compounds to adjust the absorption wavelength range of the first dye layer 183a.

The second dye may include at least one being selected from the group consisting of auramine O, crystal viole (arylmethine-based compounds), N,N'-Difluoroboryl-1,9-dimethyl-5-[(4-(2-trimethylsilylethynyl), N,N'-Difluoroboryl-1,9-dimethyl-5-phenydipyrrin (dipyrrin-based compounds), eosin Y, fluorescein, sulforhodamine 101, rhodamine 123, rhodamine 6G, rhodamine B, rose bengal (xanthene-based compounds cryptocyanine, thiacarbocyanine (C3), indodicarbocyanine (C5) and indotricarbocyanine (C7) (cyanine-based compounds). The second dye may be a mixture of at least two of the above compounds to adjust the absorption wavelength range of the second dye layer 183b.

The fourth dye may include at least one being selected from the group consisting of 4',6-diamidino-2-phenylindole (DAPI), dimethylsulfoxide, dansyl glycine, dioxane, lucifer yellow CH, hoechst 33258, DMF and piroxicam (miscellaneous-based compounds). The fourth dye may be a mixture of at least two of the above compounds to adjust the absorption wavelength range of the fourth dye.

The fifth dye may include at least one being selected from the group consisting of nile blue, oxazine 1 and NIR (oxazine-based compounds). The fifth dye may be a mixture of at least two of the above compounds to adjust the absorption wavelength range of the fifth dye.

The first substrate 101 including the second electrode 158 and the second substrate 102 including the first to third dye layers 183a to 183c are attached to each other using an adhesive layer 190. Namely, the adhesive layer 190 is disposed between the second electrode 158 and the first to third dye layers 183a to 183c. The adhesive layer 190 has a transparent property and an adhesive property.

The ambient (i.e., external) light absorption and the internal light transmittance in the OLED device 100 according to the first embodiment of the present invention are explained with reference to FIG. 2.

In a red pixel region, the first dye layer 183a includes the first, second and fourth to sixth dyes. In a green pixel region, the second dye layer 183b includes the first and third to sixth dyes. In a blue pixel region, the third dye layer 183c includes the second to sixth dyes.

The external light passes through the red, green and blue color filter patterns R, G and B and the first to third dye layers 183a to 183c, respectively.

In the red pixel region, the external light passes through the red color filter pattern R and the first dye layer 183a such that the light having a wavelength range substantially below 650 nm and above 720 nm is absorbed and the light having the wavelength range about 650 to 720 nm is transmitted through the red color filter pattern R and the first dye layer 183a. Then, the light is reflected by the second electrode 158 of the organic emitting diode E toward the first dye layer 183a. As a result, non-absorbed light having the wavelength range substantially below 650 nm and above 720 nm is absorbed again by the first dye layer 183a and the red color filter pattern R.

In the green pixel region, the external light passes through the green color filter pattern G and the second dye layer 183b such that the light having a wavelength range substantially below 490 nm and above 550 nm is absorbed and the light having the wavelength range about 490 to 550 nm is transmitted through the green color filter pattern G and the second dye layer 183b. Then, the light is reflected by the second electrode 158 of the organic emitting diode E toward the second dye layer 183b. As a result, non-absorbed light having the wavelength range substantially below 490 nm and above 550 nm is absorbed again by the second dye layer 183b and the green color filter pattern G.

In the blue pixel region, the external light passes through the blue color filter pattern B and the third dye layer 183c such that the light having a wavelength range substantially below 450 nm and above 490 nm is absorbed and the light having the wavelength range about 450 to 490 nm is transmitted through the blue color filter pattern B and the third dye layer 183c. Then, the light is reflected by the second electrode 158 of the organic emitting diode E toward the third dye layer 183c. As a result, non-absorbed light having the wavelength range substantially below 450 nm and above 490 nm is absorbed again by the third dye layer 183c and the blue color filter pattern B.

In this instance, the absorption wavelength ranges of the first to third dye layers 183a to 183c may be greater than those of the red, green and blue color filter patterns R, G and B, respectively. As a result, by disposing the first to third dye layers 183a to 183c under the first to third color filter patterns R, G and B, the reflectance of the external light is efficiently blocked such that the visibility of the OLED device 100 is improved.

In the present invention, the black matrix 182 is disposed between the color filter layer 185 and the organic emitting diode E and positioned at a boundary of adjacent color filter patterns R, G and B of the color filter layer 185. As a result, a portion of the red color filter pattern R, a portion of the green color filter pattern G and a portion of the blue color filter pattern B are disposed between the black matrix 182 and the second substrate 102. The external light is partially absorbed by the color filter patterns R, G and B and is reflected by the black matrix 182. The reflected external light is absorbed again by the color filter patterns R, G and B. On the other hand, if the black matrix 182 is directly formed on the second substrate 102, i.e., between the second substrate 102 and the color filter layer 185, the external light is directly reflected by the black matrix 182. Accordingly, in the OLED device 100, the external light reflection is decreased.

Although the dye layers 183a to 183c are between the second substrate 102 and the organic emitting diode E in the above embodiment and in FIG. 2, the second substrate 102 is between the dye layers 183a to 183c and the organic emitting diode E in another embodiment. In one embodiment, the color filter patterns R, G, and B are all above the second substrate 102, and the dye layers 183a to 183c are all above and corresponding to the color filter pattern R, G, and B, respectively. In another embodiment, the color filter patterns R, G, and B are all between the second substrate 102 and the organic emitting diode E, and the dye layers 183a to 183c are all above the second substrate 102 and corresponding to the color filter pattern R, G, and B, respectively.

As mentioned above, in the OLED device 100, the external light except the light having the wavelength range about 650 to 720 nm (e.g., red light wavelength range) is absorbed by the red color filter pattern R and the first dye layer 183a, and the external light except the light having the wavelength range about 490 to 550 nm (e.g., green light wavelength range) is absorbed by the green color filter pattern G and the second dye layer 183b. In addition, the external light except the light having the wavelength range about 450 to 490 nm (e.g., blue light wavelength range) is absorbed by the blue color filter pattern B and the third dye layer 183c. As a result, the visibility degradation of the OLED device 100 by the external (i.e., ambient) light is prevented.

On the other hand, the internal light, which is emitted from the organic emitting diode E, passes through the first to third dye layers 183a to 183c and the red, green and blue color filter patterns R, G and B, respectively.

In the red pixel region, the internal light passes through the first dye layer 183a and the red color filter pattern R such that the light having a wavelength range substantially below 650 nm and above 720 nm is absorbed and the light having the wavelength range about 650 to 720 nm is transmitted through the first dye layer 183a and the red color filter pattern R.

In the green pixel region, the internal light passes through the second dye layer 183b and the green color filter pattern G such that the light having a wavelength range substantially below 490 nm and above 550 nm is absorbed and the light having the wavelength range about 490 to 550 nm is transmitted through the second dye layer 183b and the green color filter pattern G.

In the blue pixel region, the internal light passes through the third dye layer 183c and the blue color filter pattern B such that the light having a wavelength range substantially below 450 nm and above 490 nm is absorbed and the light having the wavelength range about 450 nm to 490 nm is transmitted through the third dye layer 183c and the blue color filter pattern B.

In this instance, the center wavelengths of the transmittance wavelength ranges of the first to third dye layers 183a to 183c may be smaller than those of the red, green and blue color filter patterns R, G and B, respectively. As a result, by disposing the first to third dye layers 183a to 183c under the first to third color filter patterns R, G and B, the color purity of the OLED device 100 is improved.

As mentioned above, in the OLED device 100, the light having the wavelength range about 650 to 720 nm (e.g., red light wavelength range) of the total light from the organic emitting diode E passes through the first dye layer 183a and the red color filter pattern R, and the light having the wavelength range about 490 to 550 nm (e.g., green light wavelength range) is passes through the second dye layer 183b and the green color filter pattern G. In addition, the light having the wavelength range about 450 to 490 nm (e.g., blue light wavelength range) is passes through the third dye layer 183c and the blue color filter pattern B. As a result, the color purity of the OLED device 100 is improved.

Figure 1:
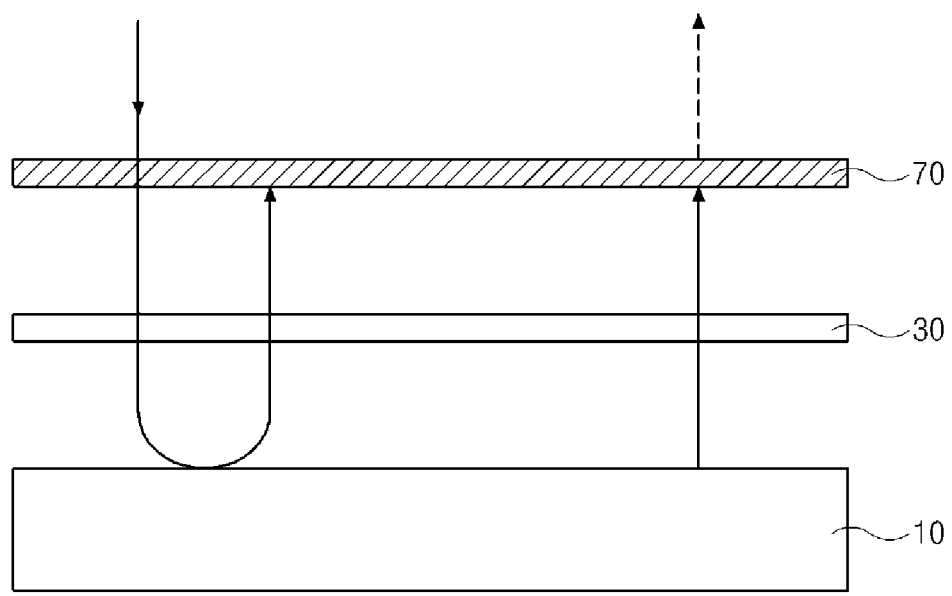
FIG. 1 is a schematic view illustrating a related art OLED device.

In addition, in the OLED device 100 of the present invention, since the visibility degradation by the external light is prevented without the circular polarization plate (of FIG. 1), the transmissivity of the internal light in the OLED device 100 is improved. Moreover, since the OLED device 100 does not require the circular polarization plate having the hard property, a flexible OLED device can be provided.

FIGS. 3A through 3F are schematic cross-sectional views illustrating a fabricating process of an OLED device according to the first embodiment of the present invention.

The fabricating process of the OLED device may include a step of forming an organic emitting diode on a first substrate in each pixel region, a step of forming a color filter layer on a second substrate, a step of forming first to third dye layers on the color filter layer and a step of attaching the first and second substrates.

In this instance, the first dye layer 183a includes the first and second dyes respectively absorbing the first and second wavelength ranges, and the second dye layer 183b include the first and third dyes respectively absorbing the first and third wavelength ranges. In addition, the third dye layer 183c includes the second and third dyes respectively absorbing the second and third wavelength ranges. Each of the first to third dye layers 183a to 183c may further include the fourth to sixth dyes.

Figure 3A:
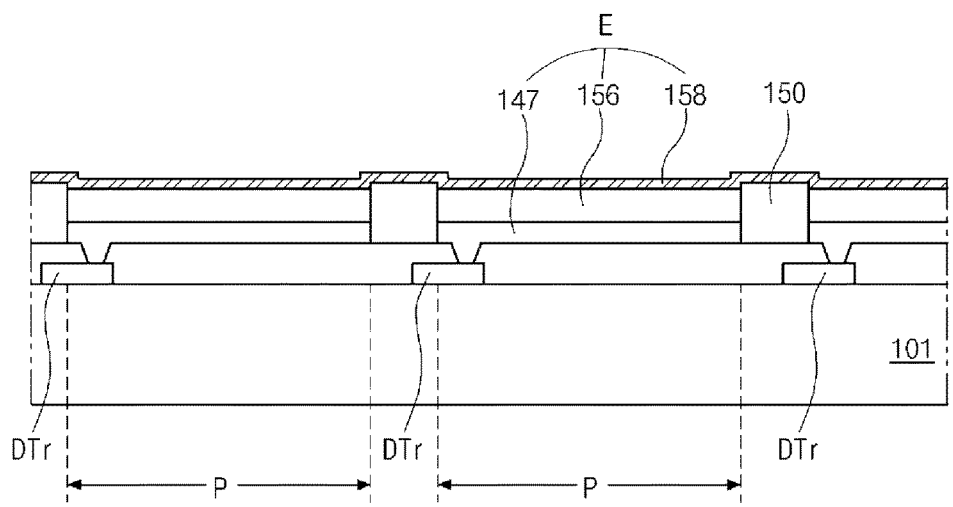
FIGS. 3A through 3F are schematic cross-sectional views illustrating a fabricating process of an OLED device according to the first embodiment of the present invention.

As shown in FIG. 3A, the driving TFT DTr is formed on the first substrate 101 in each pixel region P, and the organic emitting diode E is formed over the driving TFT DTr. The organic emitting diode E include the first and second electrodes 147 and 158 and the organic emitting layer 156 therebetween, and the first electrode 147 is electrically connected to the driving TFT DTr. In addition, the bank 150 is formed at a boundary of the pixel region P to define the pixel region P. The bank 150 may cover edges of the first electrode 147.

In this instance, the first electrode 147 may include a transparent conductive material, e.g., indium-tin-oxide (ITO) or indium-zinc-oxide (IZO), and the second electrode 158 may include a metallic material, e.g., magnesium, magnesium-silver alloy, aluminum, lithium-aluminum alloy or calcium.

Figure 3B:
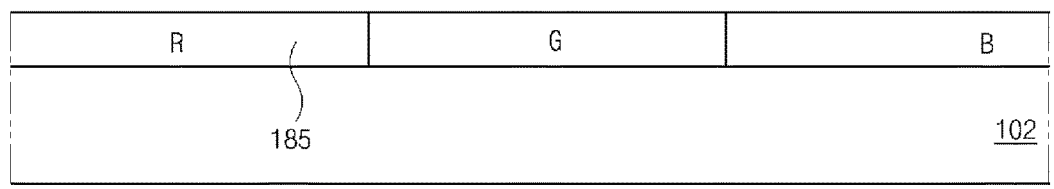

Next, as shown in FIG. 3B, the color filter layer 185 including the red, green and blue color filter patterns R, G and B is formed on the second substrate 102. The second substrate 102 may have a flexible property. For example, the second substrate 102 may include a flexible glass or a flexible plastic.

Figure 3C:
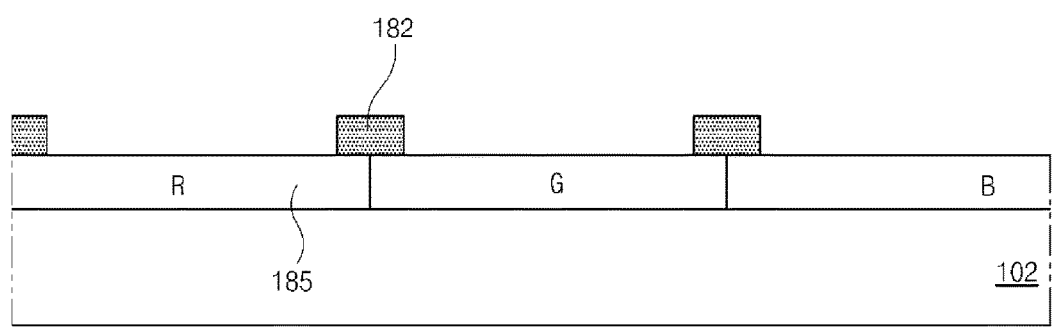

Next, as shown in FIG. 3C, the black matrix 182 corresponding to the boundary of the pixel region P is formed on the color filter layer 185.

Figure 3D:
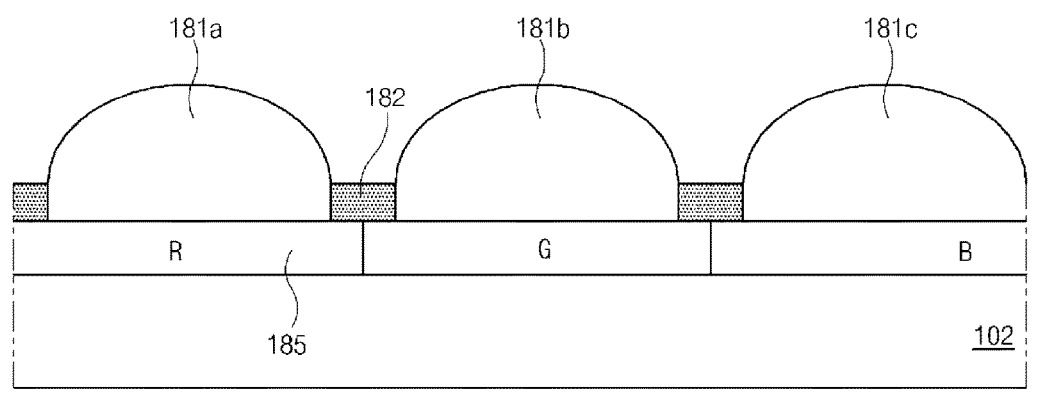
Figure 3E:
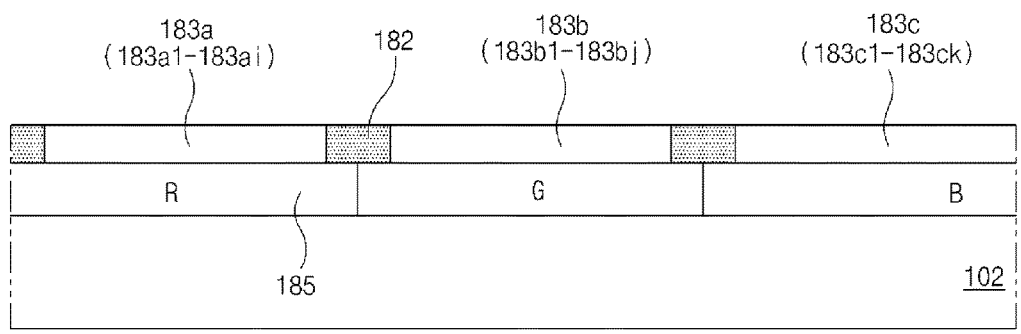
Figure 3F:
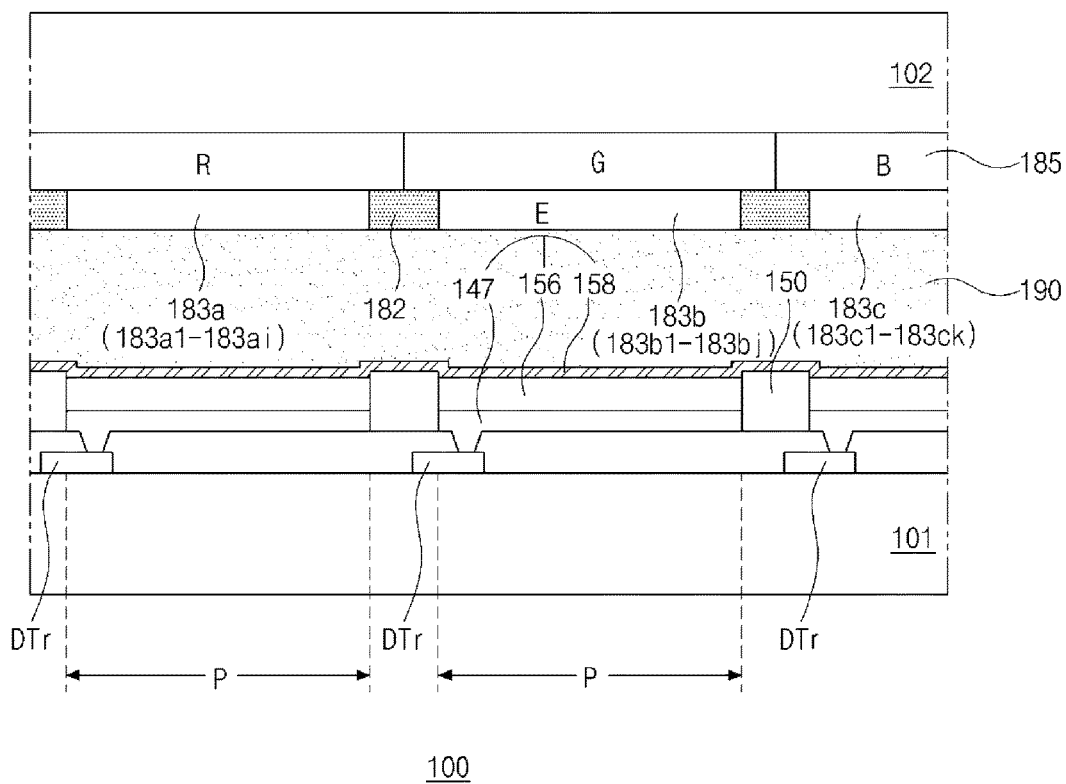

Next, as shown in FIG. 3D, a first dye solution 181a including the first and second dyes is dropped on the red color filter pattern R in the red pixel region, a second dye solution 181b including the first and third dyes is dropped on the green color filter pattern G in the green pixel region, and a third dye solution 181c including the second and third dyes is dropped on the blue color filter pattern B in the blue pixel region. The first to third dye solutions 181a to 181c may be formed by a solution process, for example, a screen printing process, an inkjet printing process and a nozzle printing process.

As mentioned above, the first dye absorbs the light of a first wavelength range, i.e., 450 to 490 nm, the second dye absorbs the light of a second wavelength range, i.e., 490 to 550 nm, and the third dye absorbs the light of a third wavelength range, i.e., 650 to 720 nm.

In addition, each of the first to third dye solutions 181a to 181c may further include at least one of the fourth to sixth dyes. The fourth dye absorbs the light of a fourth wavelength range whose center wavelength is smaller than that the first wavelength range, a fifth dye absorbs the light of a fifth wavelength range being larger than the third wavelength range, and a sixth dye absorbs the light of a sixth wavelength range between the second and third wavelength ranges.

Next, as shown in FIG. 3E, the first to third dye solutions 181a to 181c (of FIG. 3D) are dried to form the first to third dye layers 183a to 183c respectively on the red, green and blue color filter patterns R, G and B. Since the overflow of the first to third dye solutions 181a to 181c are blocked by the black matrix 182, the first to third dye solutions 181a to 181c can be dried by a single drying process. To sufficiently block the overflow of the first to third dye solutions 181a to 181c into adjacent pixel regions P, the black matrix 181 may have a hydrophobic property.

The color filter layer 185 includes pigments, while the first to third dye layers 183a to 183c include dyes. The pigment has a heat resistance property (i.e., high thermal stability), while the dye is damaged by a high temperature process (i.e., low thermal stability). Namely, if the first to third dye layers 183a to 183c are formed directly on the second substrate 102, the first to third dye layers 183a to 183c are damaged by the step of forming the black matrix 182 (i.e., a high temperature process). Accordingly, it is desired that the first to third dye layers 183a to 183c are formed before forming the color filter layer 185. In other words, the color filter layer 185 is positioned between the second substrate 102 and each of the first to third dye layers 183a to 183c.

Next, as shown in FIG. 3F, the first and second substrates 101 and 102 are attached to each other using the adhesive layer 190 such that the first to third dye layers 183a to 183c face the second electrode 158.

In FIGS. 3A to 3F, the steps of forming the color filter layer 185, the black matrix 182 and the first to third dye layers 183a to 183c are performed after the step of forming the driving TFT DTr, the bank 150 and the organic emitting diode E. However, there is no limitation in the order of these steps.

Figure 4:
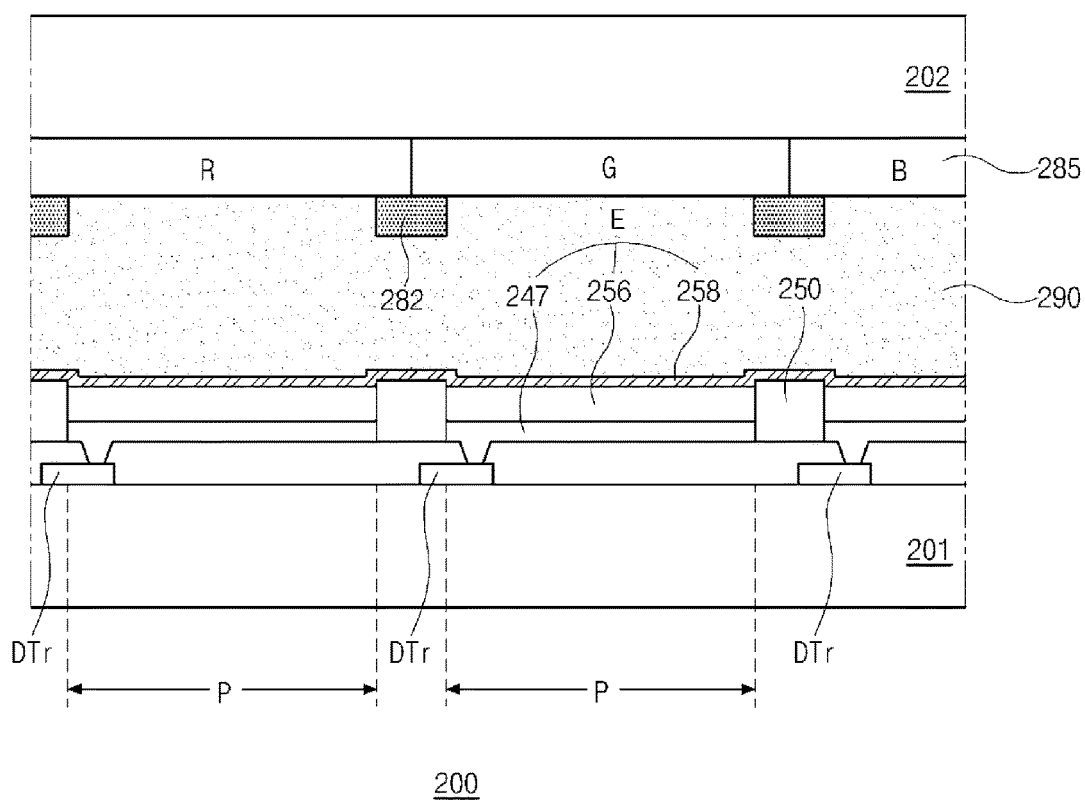
FIG. 4 is a schematic cross-sectional view of an OLED device according to a second embodiment of the present invention.

FIG. 4 is a schematic cross-sectional view of an OLED device according to the second embodiment of the present invention.

As shown in FIG. 4, the OLED device 200 includes a first substrate 201 including pixel regions P, a second substrate 202 facing the first substrate 201, an organic emitting diode E, a color filter layer 285 including red, green and blue color filter patterns R, G and B and an adhesive layer 290 including first to third dyes. The pixel regions P includes red, green and blue pixel regions P, and the red, green and blue color filter patterns R, G and B respectively corresponds to the red, green and blue pixel regions P.

Each of the first and second substrates 201 and 202 may have a flexible property. For example, each of the first and second substrates 201 and 202 may include a flexible glass or a flexible plastic.

A driving thin film transistor (TFT) DTr is formed on or over the substrate 201 in each pixel region P, and a bank 250 is formed over the first substrate 201 at a boundary of the pixel regions P.

The organic emitting diode E is disposed between the first and second substrates 201 and 202 and is electrically connected to the driving TFT DTr. The organic emitting diode E includes first and second electrodes 247 and 258 and an organic emitting layer 256 between the first and second electrodes 247 and 258. The first electrode 247 is electrically connected to an electrode of the driving TFT DTr and has an island shape in each pixel region P to be separated in adjacent pixel regions P. The organic emitting layer 256 in the pixel regions P is formed of the same material. For example, the white light may be emitted from the organic emitting layer 256 in all of the pixel regions P. The second electrode 258 covers an entire of a display area of the OLED device 200.

The first electrode 247 may include a relatively high work function material to serve as an anode, and the second electrode 258 may include a relatively low work function material to serve as a cathode. For example, the first electrode 247 may include a transparent conductive material, e.g., indium-tin-oxide (ITO) or indium-zinc-oxide (IZO), and the second electrode 258 may include a metallic material, e.g., magnesium, magnesium-silver alloy, aluminum, lithium-aluminum alloy or calcium.

The color filter layer 285 is formed on or over the second substrate 202, and a black matrix 282, which has a lattice shape and corresponds to a boundary of the pixel regions P, is formed on the color filter layer 285. Namely, the black matrix 282 may overlap the bank 250. The black matrix 282 may be omitted.

The adhesive layer 290 including first to third dyes is disposed between the color filter layer 185 and the second electrode 258. The first and second substrates 201 and 202 are attached to each other by the adhesive layer 290 to provide the OLED device 200.

The first dye absorbs the light having a first wavelength range below about 450 nm, the second dye absorbs the light having a second wavelength range of about 550 to 650 nm, and the third dye absorbs the light having a third wavelength range above about 720 nm.

For example, the first dye may include at least one being selected from the group consisting of 4',6-diamidino-2-phenylindole (DAPI), dimethylsulfoxide, dansyl glycine, dioxane, lucifer yellow CH, hoechst 33258, DMF and piroxicam (miscellaneous-based compounds). The first dye may be a mixture of at least two of the above compounds to adjust the absorption wavelength range of the first dye.

The second dye may include at least one being selected from the group consisting of cryptocyanine, thiacarbocyanine (C3), indodicarbocyanine (C5) and indotricarbocyanine (C7) (cyanine-based compounds). The second dye may be a mixture of at least two of the above compounds to adjust the absorption wavelength range of the second dye.

The third dye may include at least one being selected from the group consisting of nile blue, oxazine 1 and NIR (oxazine-based compounds). The third dye may be a mixture of at least two of the above compounds to adjust the absorption wavelength range of the third dye.

Since the first to third dyes are included into the adhesive layer 290, one side of the adhesive layer 290 contacts the color filter layer 285.

The ambient (i.e., external) light absorption and the internal light transmittance in the OLED device 200 according to the first embodiment of the present invention are explained.

The external light passes through the red, green and blue color filter patterns R, G and B and the adhesive layer 290, respectively.

The external light passes through the red, green and blue color filter patterns R, G and B and the adhesive layer 290 such that the light having a wavelength range below 450 nm, between 550 nm and 650 nm and above 720 nm is absorbed and the light having the wavelength range between 450 nm and 550 nm and between 650 nm and 720 nm is transmitted through the red, green and blue color filter patterns R, G and B and the adhesive layer 290. Then, the light is reflected by the second electrode 258 of the organic emitting diode E toward the adhesive layer 290. As a result, non-absorbed light having the wavelength range below 450 nm, between 550 nm and 650 nm and above 720 nm is absorbed again by the adhesive layer 290 and the red, green and blue color filter patterns R, G and B.

In this instance, the absorption wavelength ranges of the adhesive layer 290 may be greater than those of the color filter layer 285 including the red, green and blue color filter patterns R, G and B, respectively. As a result, by disposing the adhesive layer 290 under the first to third color filter layer 285, the reflectance of the external light is efficiently blocked such that the visibility of the OLED device 200 is improved.

In the present invention, the black matrix 282 is disposed between the color filter layer 285 and the organic emitting diode E and positioned at a boundary of adjacent color filter patterns R, G and B of the color filter layer 285. As a result, a portion of the red color filter pattern R, a portion of the green color filter pattern G and a portion of the blue color filter pattern B are disposed between the black matrix 282 and the second substrate 202. The external light is partially absorbed by the color filter patterns R, G and B and is reflected by the black matrix 282. The reflected external light is absorbed again by the color filter patterns R, G and B. Accordingly, in the OLED device 200, the external light reflection is decreased.

As mentioned above, in the OLED device 200, the external light except the light having the wavelength range of 450 to 490 nm (e.g., blue light wavelength range), 490 to 550 nm (e.g., green light wavelength range) and 650 to 720 nm (e.g., red light wavelength range) is absorbed by the color filter layer 285 and the adhesive layer 290. As a result, the visibility degradation of the OLED device 200 by the external (i.e., ambient) light is prevented.

On the other hand, the internal light, which is emitted from the organic emitting diode E, passes through the adhesive layer 290 and the red, green and blue color filter patterns R, G and B, respectively.

The internal light passes through the adhesive layer 290 and the red, green and blue color filter patterns R, G and B such that the light having a wavelength range below 450 nm, between 550 nm and 650 nm and above 720 nm is absorbed and the light having the wavelength range of 450 to 550 nm and 650 to 720 nm is transmitted through the adhesive layer 290 and the color filter layer 285.

In this instance, the transmittance wavelength ranges of the adhesive layer 290 may be smaller than those of the color filter layer 285, respectively. As a result, by disposing the adhesive layer 290 under the color filter layer 285, the color purity of the OLED device 200 is improved.

As mentioned above, in the OLED device 200, the light having the wavelength range of 650 to 720 nm (e.g., red light wavelength range) of the total light from the organic emitting diode E passes through the adhesive layer 290 and the red color filter pattern R, and the light having the wavelength range of 490 to 550 nm (e.g., green light wavelength range) is passes through the adhesive layer 290 and the green color filter pattern G. In addition, the light having the wavelength range of 450 to 490 nm (e.g., blue light wavelength range) is passes through the adhesive layer 290 and the blue color filter pattern B. As a result, the color purity of the OLED device 200 is improved.

In addition, in the OLED device 200 of the present invention, since the visibility degradation by the external light is prevented without the circular polarization plate (of FIG. 1), the transmissivity of the internal light in the OLED device 200 is improved. Moreover, since the OLED device 200 does not require the circular polarization plate having the hard property, a flexible OLED device can be provided. Further, though the color filter plate including the second substrate 102, the black matrix 182, the dye layers 183a to 183c, and the color filter layer 185 is used in the OLED device 200, the color filter plate may be used in other type of display device such as a LCD display device to provide similar effect and benefit.

It will be apparent to those skilled in the art that various modifications and variations can be made in the embodiments of the invention without departing from the spirit or scope of the invention. Thus, it is intended that the embodiments of the invention cover the modifications and variations of this invention provided they come within the scope of the appended claims and their equivalents.

What is claimed is:

1. A color filter plate for a display device, the color filter plate comprising:
    a substrate including a first pixel region;
    a first color filter pattern over the substrate and transmitting light having a first wavelength range; and
    a first dye layer corresponding to the first color filter pattern and over the substrate, the first dye layer including first and second dyes,
    wherein the first dye absorbs light having a second wavelength range other than the first wavelength range, and the second dye absorbs light having a third wavelength range other than the first wavelength range and the second wavelength range.

2. The color filter plate according to claim 1, wherein the substrate further includes a second pixel region and a third pixel region, and the color filter plate further comprises:
    a second color filter pattern over the substrate and transmitting light having the third wavelength range;
    a second dye layer corresponding to the second color filter pattern and over the substrate, the second dye layer including the first dye and a third dye;
    a third color filter pattern over the substrate and transmitting light having the second wavelength range; and
    a third dye layer corresponding to the third color filter pattern and over the substrate, the third dye layer including the second and third dyes,
    wherein the third dye absorbs light having the first wavelength range.

3. The color filter plate according to claim 1, further comprising:
    a black matrix at a boundary of the first color filter pattern,
    wherein a portion of the first color filter pattern is positioned between the black matrix and the substrate.

4. The color filter plate according to claim 1, wherein the first wavelength range is 450 to 490 nm, and the second wavelength range is 490 to 550 nm, and
    wherein the third wavelength range is 650 to 720 nm.

5. The color filter plate according to claim 1, wherein each of the first to third dye layers further includes fourth, fifth and sixth dyes,
    wherein the fourth dye absorbs light having a wavelength range being smaller than the first wavelength range, and the fifth dye absorbs light having a wavelength range being greater than the third wavelength range, and wherein the sixth dye absorbs light having a wavelength range between the second and third wavelength range.

6. The color filter plate according to claim 2, further comprising:
    a black matrix at a boundary between the first color filter pattern and the second color filter pattern,
    wherein a portion of each of the first color filter pattern and the second color filter pattern is positioned between the black matrix and the substrate.

7. The color filter plate according to claim 2, wherein the first, second and third dye layers are disposed under the first, second and third color filter patterns.

8. The color filter plate according to claim 6, wherein the first to third dye layers and the black matrix provide a flat top surface.

9. The color filter plate according to claim 3, wherein the black matrix has a hydrophobic property.

10. A display panel, comprising:
    first and second substrates facing each other and including a first pixel region;
    a thin-film transistor between the first substrate and the second substrate;
    a first color filter pattern over the second substrate and transmitting light having a first wavelength range; and
    a first dye layer corresponding to the first color filter pattern and over the second substrate, the first dye layer including first and second dyes,
    wherein the first dye absorbs light having a second wavelength range other than the first wavelength range, and the second dye absorbs light having a third wavelength range other than the first wavelength range and the second wavelength range.

11. The display panel according to claim 10, comprising:
    an organic emitting diode between the first substrate and the second substrate.

12. An organic light emitting display device, comprising:
    first and second substrates facing each other and including a first pixel region;
    an organic emitting diode between the first and second substrates and in the first pixel region; and
    an adhesive layer between the second substrate and the organic emitting diode and including first, second and third dyes,
    wherein the first dye absorbs light having a wavelength range below 450 nm, and the second dye absorbs light having a wavelength range of 550 to 650 nm, and
    wherein the third dye absorbs light having a wavelength range above 720 nm.

13. The organic light emitting display device according to claim 12, further comprising a color filter layer between the second substrate and the first substrate,
    wherein the color filter layer includes a first color filter pattern, a second color filter pattern, and a third color filter pattern.

14. The organic light emitting display device according to claim 13, wherein the color filter layer is between the second substrate and the adhesive layer.

15. The organic light emitting display device according to claim 13, wherein the adhesive layer contacts the color filter layer.

16. The organic light emitting display device according to claim 13, further comprising:
    a black matrix at a boundary of the first, second, and third color filter patterns,
    wherein a portion of the first color filter pattern, a portion of the second color filter pattern and a portion of the third color filter pattern are positioned between the black matrix and the second substrate.

17. A method of fabricating an organic light emitting display device, comprising:
    forming an organic emitting diode on a first substrate including red, green and blue pixel regions;
    forming red, green and blue color filter pattern on a second substrate to form a color filter layer, the red, green and blue color filter patterns respectively corresponding to the red, green and blue pixel regions;
    forming first, second and third dye layers respectively on the red, green and blue color filter patterns; and
    attaching the first and second substrates,
    wherein the first dye layer includes first and second dyes, and the second dye layer includes the first dye and a third dye,
    wherein the third dye layer includes the second and third dyes, and the first to third dyes respectively absorbs light having first to third wavelength ranges, respectively, and
    wherein the second wavelength range is larger than the first wavelength range and smaller than the third wavelength range.

18. The method according to claim 17, further comprising:
    forming a black matrix on the color filter layer at a boundary of the red, green and blue pixel regions before the step of forming the first to third dye layers.

19. The method according to claim 18, wherein the step of forming the first to third dye layers is performed by a solution process, and the black matrix has a hydrophobic property.

20. The method according to claim 18, wherein the step of forming the first to third dye layers includes:
    dropping a first dye solution on the red color filter pattern;
    dropping a second dye solution on the green color filter pattern;
    dropping a third dye solution on the blue color filter pattern; and
    drying the first to third dye solution by a single drying process to form the first to third dye layers.

* * * * *